(12) United States Patent
Lee

(10) Patent No.: US 7,037,137 B2
(45) Date of Patent: May 2, 2006

(54) SHIELDING CAGE ASSEMBLY WITH REINFORCING DIVIDING WALLS

(75) Inventor: Chieh Lee, Tu-Cheng (TW)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 10/892,842

(22) Filed: Jul. 16, 2004

(65) Prior Publication Data
US 2005/0208831 A1    Sep. 22, 2005

(30) Foreign Application Priority Data
Mar. 19, 2004    (TW) ............................. 93204168 U

(51) Int. Cl.
*H01R 13/648* (2006.01)
(52) U.S. Cl. ...................... 439/608; 439/607
(58) Field of Classification Search ......... 439/607–610
See application file for complete search history.

(56) References Cited

U.S. PATENT DOCUMENTS

| | | | |
|---|---|---|---|
| 6,317,317 B1 * | 11/2001 | Lu et al. ................ | 361/685 |
| 6,517,382 B1 | 2/2003 | Flickinger et al. ......... | 439/607 |
| 6,666,694 B1 * | 12/2003 | Daly et al. .................. | 439/79 |
| 6,724,641 B1 * | 4/2004 | Hwang ..................... | 361/818 |
| 6,878,872 B1 * | 4/2005 | Lloyd et al. .............. | 174/35 R |

* cited by examiner

*Primary Examiner*—Michael C. Zarroli
(74) *Attorney, Agent, or Firm*—Morris Manning & Martin; Tim Tingkang Xia, Esq.

(57) ABSTRACT

A shielding cage assembly (10) for accommodating transceiver modules includes a body cage (1), a cover cage (2), and dividing walls (3). The body cage includes a bottom wall (11) with front cutouts (112), and two side walls (12). The cover cage includes a top wall (21) with front cutouts (215). Each dividing wall has top and bottom barbs (317) at a front end thereof. In assembly, the barbs are engaged in the corresponding cutouts. The bottom wall, side walls, dividing walls and cover cage cooperatively define cavities therebetween for receiving the transceiver modules. The mechanical strength of the shielding cage assembly at front openings of the cavities is enhanced by the barbs of the dividing walls being engaged in the cutouts of the body cage and the cover cage. The shielding cage assembly can therefore withstand repeated insertion and removal of the transceiver modules without sustaining expansion or distortion.

18 Claims, 2 Drawing Sheets

SHIELDING CAGE ASSEMBLY WITH REINFORCING DIVIDING WALLS

BACKGROUND OF THE INVENTION

1. Field of the Invention

The present invention relates to shielding cages for shielding electronic apparatuses accommodated therein from electromagnetic interference (EMI), and particularly to a shielding cage assembly for receiving a plurality of transceiver modules therein.

2. Prior Art

A transceiver module is a discrete unit used in interface communication equipment. U.S. Pat. No. 6,517,382 discloses a receptacle for a pluggable module. The module is singly received in the receptacle, which provides shielding against EMI. Conventionally, a group of transceiver modules is received in respective individual cages. The need for a plurality of cages multiplies costs proportionately. Furthermore, when the group of transceiver modules is attached to a printed circuit board, it is difficult to achieve a high-density assembly because of the combined bulk of the cages.

U.S. Pat. No. 6,724,641 entitled "Shielding Cage Assembly Adapted For Multiple Transceiver Modules" discloses a shielding cage assembly for shielding a plurality of transceiver modules therein. The shielding cage assembly includes a conductive body cage, a conductive cover cage and a plurality of dividing walls, which cooperatively define a plurality of spaces for receiving the transceiver modules. However, the strength of the shielding cage assembly at front ends of the dividing walls is limited. After repeated plugging and unplugging of transceiver modules, the shielding cage assembly is liable to become fatigued, and openings of the spaces at the front of the shielding cage assembly may expand. When this happens, the transceiver modules may no longer be able to be securely connected in the shielding cage assembly, and the operation of the transceiver modules may be impaired or disrupted.

Thus, a need exists for a shielding cage assembly for transceiver modules which overcomes the above-described problems.

SUMMARY OF THE INVENTION

An object of the present invention is to provide a shielding cage assembly for receiving a plurality of transceiver modules therein, the shielding cage assembly having a strong structure at front openings thereof.

To accomplish the above-mentioned object, the present invention provides a shielding cage assembly for accommodating a plurality of transceiver modules. The shielding cage assembly is made of electrically conductive material, and includes a body cage, a cover cage, and a plurality of dividing walls. The body cage includes a bottom wall with a plurality of cutouts defined in a front edge portion thereof, and two side walls. The cover cage includes a top wall with a plurality of cutouts defined in a front edge portion thereof. Each dividing wall has a pair of top and bottom barbs at a front end thereof. In assembly, the barbs of the dividing walls are engaged in the corresponding cutouts of the body cage and the cover cage. The bottom wall, side walls, dividing walls and cover cage cooperatively define a plurality of cavities therebetween for receiving the transceiver modules therein.

The mechanical strength of the shielding cage assembly at front openings of the cavities is enhanced by the barbs of the dividing walls being engaged in the cutouts of the body cage and the cover cage. The shielding cage assembly can therefore withstand repeated insertion and removal of the transceiver modules without sustaining expansion or distortion. In addition, the shielding cage assembly can reduce costs and achieve a high-density assembly by closely accommodating the plurality of transceiver modules therein. Furthermore, EMI shielding of the transceiver modules is achieved by the shielding cage assembly being made of electrically conductive material.

Other objects, advantages and novel features of the present invention will be drawn from the following detailed description with reference to the attached drawings, in which:

DETAILED DESCRIPTION OF THE PREFERRED EMBODIMENT

Figure 1:
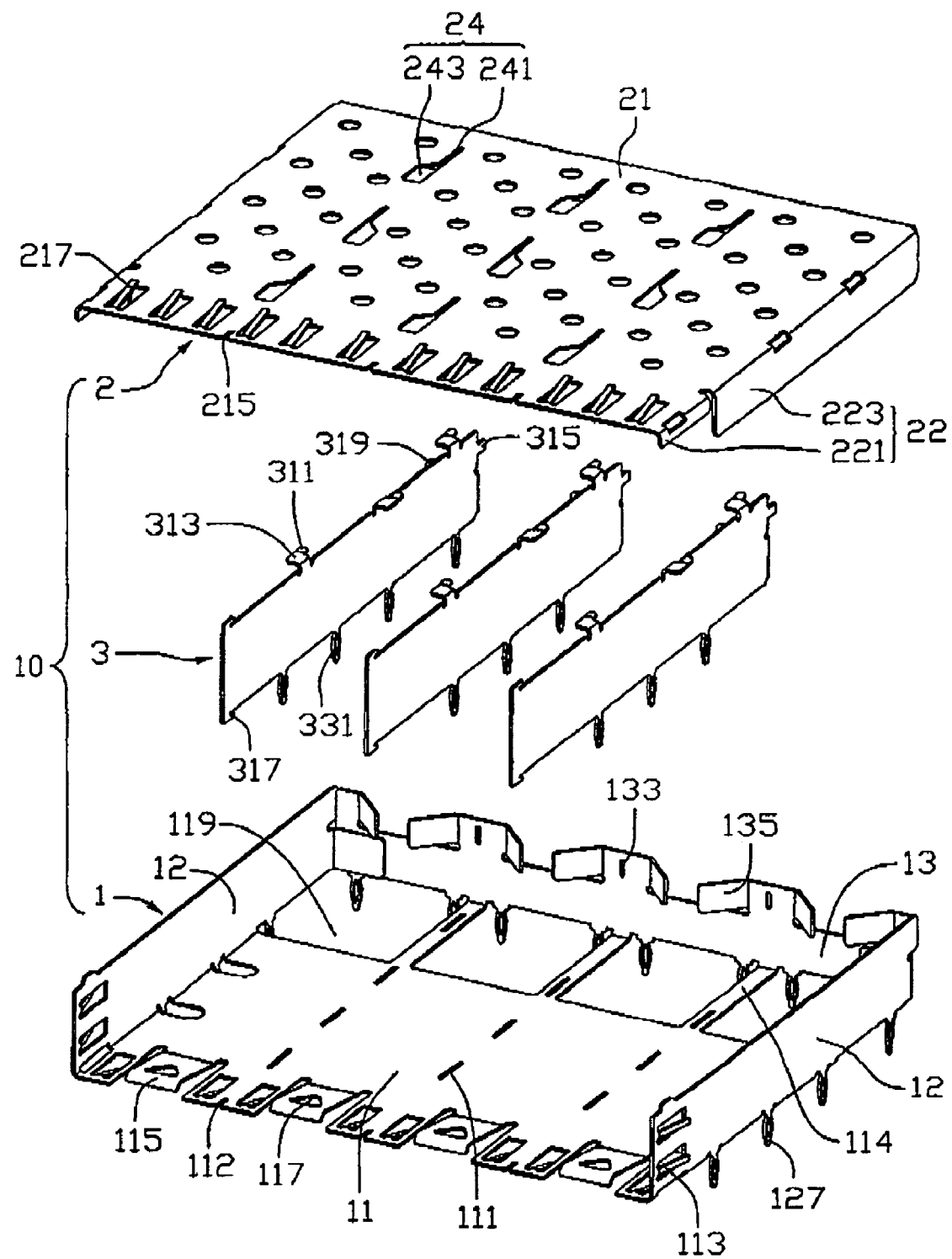
FIG. 1 is an exploded, isometric view of a shielding cage assembly in accordance with the present invention, the shielding cage assembly including a body cage, a plurality of dividing walls, and a cover cage.

Referring to FIG. 1, a shielding cage assembly 10 in accordance with the present invention is made of electrically conductive material, and comprises a body cage 1, a cover cage 2 and a plurality of dividing walls 3. The body cage 1, the cover cage 2 and the dividing walls 3 cooperatively form a plurality of cavities for receiving a plurality of transceiver modules (not shown) therein.

The body cage 1 includes a bottom wall 11, two side walls 12, and a back wall 13. The side walls 12 extend up from two sides of the bottom wall 11 respectively. The bottom wall 11 defines a plurality of bottom openings 119 aligned adjacent the back wall 13, thereby a plurality of end portions 114 is formed in the bottom wall 11. The back wall 13 extends up from the end portions 114 of the bottom wall 11. Electrical connectors can extend into the shielding cage assembly 10 and connect with corresponding transceiver modules through the bottom openings 119 of the bottom wall 11. A plurality of notches 111 is defined through the bottom wall 11. The notches 111 are arranged in a plurality of parallel lines, the lines being parallel to the side walls 12. Each of the lines corresponds to a region of the bottom wall 11 between respective adjacent bottom openings 119. A plurality of cutouts 112 is defined in a front edge portion of the bottom wall 11, in alignment with the lines of notches 111 respectively. For facilitating EMI suppression, a plurality of spring tabs 113 is formed at the front end of the bottom wall 11 and at front ends of the side walls 12. A plurality of releasing tabs 115 extends obliquely upwardly from the bottom wall 11 at the front end thereof. Each releasing tab 115 defines a triangular opening 117 therethrough, for securing a corresponding transceiver module in the shielding cage assembly 10. The releasing tab 115 can be pulled downwardly to remove the transceiver module from the shielding cage assembly 10. A plurality of holes 133 is defined at the back wall 13, corresponding to the lines of notches 111 respectively. A plurality of pairs of pushing tabs 135 extends obliquely inwardly from the back wall 13. Each pair of pushing tabs 135 corresponds to a respective one of the bottom openings 119. Each pair of pushing tabs 135 can push out the corresponding transceiver module from the shielding cage assembly 10 when the corresponding releasing tab 115 is depressed. A plurality of mounting pins 127 extends downwardly from bottom edges of the side walls 12 and a bottom edge of the back wall 13.

The cover cage 2 includes a top wall 21, and two side walls 22 and a back wall (not shown) respectively extending downwardly from two side edges and a rear edge of the top wall 21. Each side wall 22 includes a forward side wall 221 and a rearward side wall 223. The rearward side wall 223 is longer and higher than the forward side wall 221, and overlaps a majority portion of a corresponding side wall 12 of the body cage 1 when the cover cage 2 is attached to the body cage 1. A plurality of slots 24 is defined through the top wall 21. The slots 24 are arranged in a plurality of parallel lines, the lines being parallel to the side walls 22 and corresponding to the lines of notches 111 of the body cage 1 respectively. Each slot 24 has a seam portion 241, and an enlarged opening 243 in communication with the seam portion 241. A plurality of cutouts 215 is defined in a front edge portion of the top wall 21, in alignment with the seam portions 241 respectively. A plurality of spring tabs 217 extends obliquely upwardly from the front edge portion of the top wall 21, for facilitating EMI suppression.

Each dividing wall 3 is elongated, and includes a plurality of retaining tabs 311 projecting upwardly and then horizontally from a top edge thereof, two barbs 317 projecting backwardly from the top and a bottom edge respectively of a front end thereof, a plurality of mounting pins 331 extending downwardly from the bottom edge thereof, a peg 315 projecting backwardly from an upper portion of a rear edge thereof, and a weld member 319 extending perpendicularly from the rear edge below the peg 315. Each retaining tab 311 comprises a horizontal engaging portion 313. The engaging portions 313 are staggered at respective opposite sides of the top edge of the dividing wall 3. A top profile of each retaining tab 311 is smaller than each enlarged opening 243 of the cover cage 2. The barbs 317 are engaged in corresponding cutouts 112, 215 of the body cage 1 and the cover cage 2. The mounting pins 331 are engaged in corresponding notches 111 of the body cage 1. The peg 315 is engaged in a corresponding hole 133 of the body cage 1. The weld member 319 abuts the back wall 13 of the body cage 1.

Figure 2:
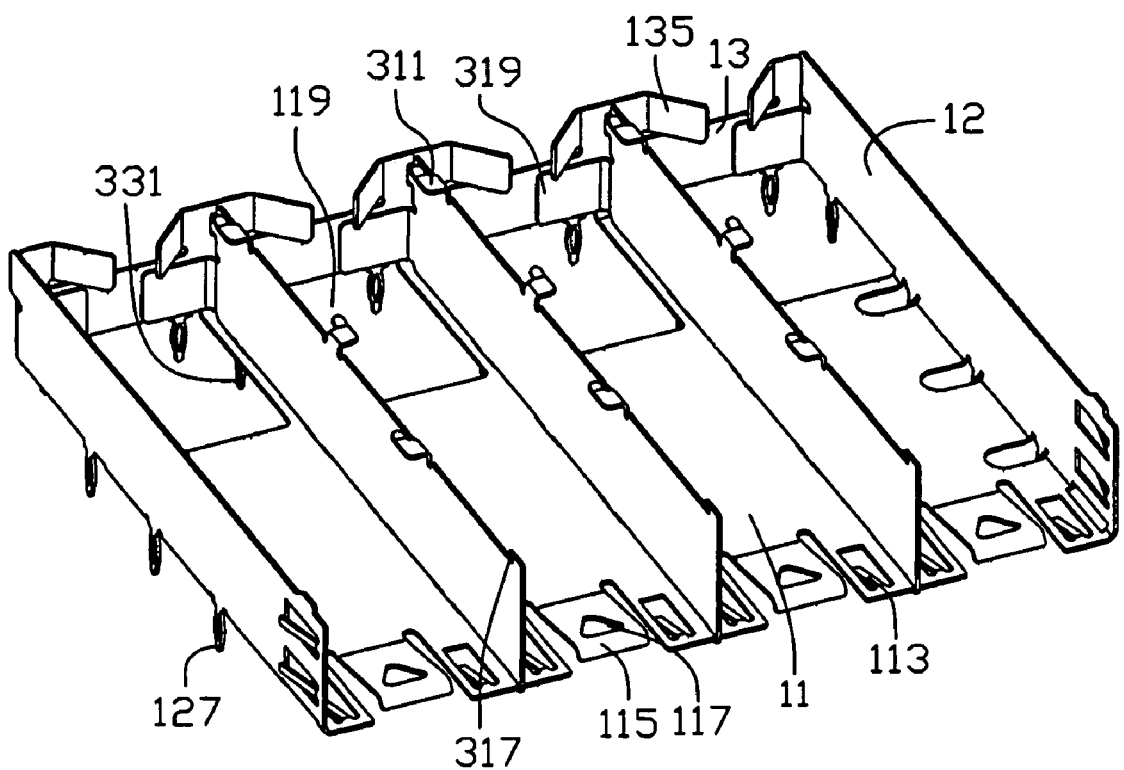
FIG. 2 is an assembled view of the body cage and the dividing walls of FIG. 1, but viewed from another aspect.

Referring also to FIG. 2, in assembly, the dividing walls 3 are fitted into the body cage 1. The mounting pins 331 of the dividing walls 3 are inserted into the notches 111 of the body cage 1. The bottom barbs 317 of the dividing walls 3 are engaged in the cutouts 112 of the body cage 1. The pegs 315 of the dividing walls 3 are inserted into the holes 133 of the body cage 1. The weld members 319 of the dividing walls 3 are soldered to the back wall 13 of the body cage 1.

Figure 3:
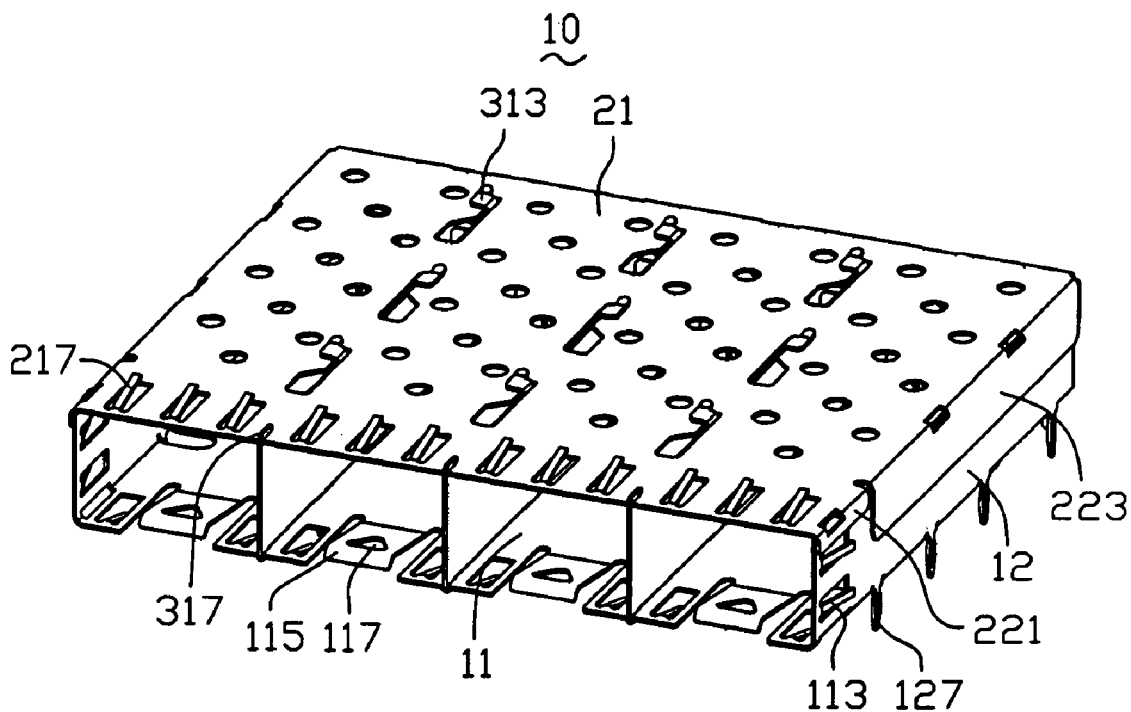
FIG. 3 is an assembled view of FIG. 1.

Referring also to FIG. 3, the cover cage 2 is then attached to the combined body cage 1 and dividing walls 3. The retaining tabs 311 are passed through the openings 243 of the slots 24, and then the cover cage 2 is pushed forwardly along the body cage 1. The seam portions 241 of the slots 24 fixedly receive the retaining tabs 311, with the engaging portions 313 abutting the top wall 21 of the cover cage 2. At the same time, the cutouts 215 of the top wall 21 engagingly receive the top barbs 317 of the dividing walls 3. The rearward side walls 223 of the cover cage 2 are soldered to the side walls 12 of the body cage 1, thereby completing assembly of the shielding cage assembly 10. The plurality of cavities formed within the shielding cage assembly 10 can receive a plurality of transceiver modules therein.

The mechanical strength of the shielding cage assembly 10 at front openings of the cavities is enhanced by the engagement of the barbs 317 of the dividing walls 3 with the body cage 1 and the cover cage 2. The shielding cage assembly 10 can therefore withstand repeated insertion and removal of the transceiver modules without sustaining expansion or distortion. In addition, the shielding cage assembly 10 can reduce costs and achieve a high-density assembly by closely accommodating the plurality of transceiver modules therein. Furthermore, EMI shielding of the transceiver modules is achieved by the shielding cage assembly 10 being made of electrically conductive material.

When the shielding cage assembly 10 is mounted to a printed circuit board (not shown), the mounting pins 127, 331 are received in mounting holes of the printed circuit board, and the mounting pins 127, 331 can be soldered or otherwise fixed therein. For instance, the mounting pins 127, 331 can be elongated, "needle eye," deformable, press-fit type pins, which are larger than the mounting holes. The mounting pins 127, 331 are thus interferingly engaged in the mounting holes. The mounting pins 127, 331 thus provide stable mounting of the shielding cage assembly 10 on the printed circuit board.

It is to be understood that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shielding cage assembly for accommodating a plurality of transceiver modules, comprising:
   an electrically conductive body cage comprising a bottom wall, two side walls, a back wall extending up from end portions of the bottom wall, and a plurality of mounting pins extending downwardly from bottom edges of the side walls and the back wall, a front edge portion of the bottom wall defining a plurality of cutouts therein;
   an electrically conductive cover cage comprising a top wall, a front edge portion of the top wall defining a plurality of cutouts therein; and
   a plurality of electrically conductive dividing walls respectively defining a plurality of barbs provided at front ends thereof; wherein
   the barbs are engaged in corresponding cutouts of the body cage and the cover cage, and the bottom wall, the side walls, the dividing walls and the cover cage cooperatively define a plurality of cavities therebetween for receiving the transceiver modules therein.

2. The shielding cage assembly as claimed in claim 1, wherein the body cage defines a plurality of bottom openings aligned adjacent the back wall.

3. The shielding cage assembly as claimed in claim 2, wherein the body cage further defines a plurality of notches through the bottom wall, the notches being arranged in a plurality of parallel lines.

4. The shielding cage assembly as claimed in claim 1, wherein the body cage further defines a plurality of holes at the back wall.

5. The shielding cage assembly as claimed in claim 4, wherein the back wall further comprises pushing tabs extending obliquely inwardly therefrom.

6. The shielding cage assembly as claimed in claim 1, wherein the top wall of the cover cage comprises two side walls and a back wall respectively extending downwardly from two side edges and a rear edge thereof, each of the side walls of the cover cage comprises a forward side wall and a rearward side wall, the rearward side wall being longer and higher than the forward side wall.

7. The shielding cage assembly as claimed in claim 1, wherein the top wall of the cover cage further defines a plurality of slots.

8. The shielding cage assembly as claimed in claim 7, wherein each of the slots comprises a seam portion and an enlarged opening in communication with the seam portion.

9. The shielding cage assembly as claimed in claim 8, wherein each of the dividing walls comprises a plurality of retaining tabs projecting upwardly and then horizontally from a top edge thereof.

10. The shielding cage assembly as claimed in claim 9, wherein each of the retaining tabs comprises a horizontal engaging portion.

11. The shielding cage assembly as claimed in claim 10, wherein the engaging portions of the retaining tabs are staggered at respective opposite sides of the top edge of the dividing wall, and a top profile of each retaining tab is smaller than each enlarged opening of the cover cage.

12. The shielding cage assembly as claimed in claim 1, wherein each of the dividing walls comprises a plurality of mounting pins extending downwardly from a bottom edge thereof.

13. The shielding cage assembly as claimed in claim 1, wherein a peg projects backwardly from an upper portion of a rear edge of each dividing wall.

14. The shielding cage assembly as claimed in claim 1, wherein a weld member extends perpendicularly from a rear edge of each dividing wall.

15. A shielding cage assembly comprising:
an electrically conductive body cage comprising a bottom wall, and a back wall extending up from end portions of the bottom wall, a plurality of mounting pins extending downwardly from bottom edges of the back wall;
an electrically conductive cover cage coupled to the body cage; and
a plurality of electrically conductive dividing walls coupled to the cover cage and the body cage,
wherein the dividing walls comprise a plurality of barbs provided at front ends thereof, the body cage and the cover cage respectively define a plurality of cutouts, and the barbs are engaged in corresponding cutouts of the body cage and the cover cage.

16. A shielding cage assembly for accommodating a plurality of transceiver modules, comprising:
an electrically conductive body cage comprising a bottom wall and two side walls, a front edge portion of the bottom wall defining a plurality of cutouts therein;
an electrically conductive cover cage comprising a top wall, a front edge portion of the top wall defining a plurality of cutouts therein, the top wall defining a plurality of slots, each of the slots comprising a seam portion and an enlarged opening in communication with the seam portion; and
a plurality of electrically conductive dividing walls, each of the dividing walls comprising a plurality of barbs provided at front ends thereof, and a plurality of retaining tabs projecting upwardly and then horizontally from a top edge thereof; wherein
the barbs are engaged in corresponding cutouts of the body cage and the cover cage, and the bottom wall, the side walls, the dividing walls and the cover cage cooperatively define a plurality of cavities therebetween for receiving the transceiver modules therein.

17. The shielding cage assembly as claimed in claim 16, wherein each of the retaining tabs comprises a horizontal engaging portion.

18. The shielding cage assembly as claimed in claim 17, wherein the engaging portions of the retaining tabs are staggered at respective opposite sides of the top edge of the dividing wall, and a top profile of each retaining tab is smaller than each enlarged opening of the cover cage.

* * * * *